United States Patent [19]

Homma

[11] Patent Number: 5,334,552
[45] Date of Patent: Aug. 2, 1994

[54] METHOD FOR FABRICATING A SEMICONDUCTOR DEVICE HAVING A MULTI-LAYERED INTERCONNECTION STRUCTURE

[75] Inventor: Tetsuya Homma, Tokyo, Japan
[73] Assignee: NEC Corporation, Japan
[21] Appl. No.: 980,901
[22] Filed: Nov. 24, 1992
[30] Foreign Application Priority Data
Dec. 4, 1991 [JP] Japan .................. 3-319549
[51] Int. Cl.⁵ .................................. H01L 21/90
[52] U.S. Cl. ................................ 437/195; 437/238;
437/228; 148/DIG. 118
[58] Field of Search ............ 437/195, 238, 228;
148/DIG. 118

[56] References Cited
U.S. PATENT DOCUMENTS 4,894,352  1/1990  Lane et al. ............ 148/DIG. 118
5,215,787  6/1993  Homma ...................... 156/656

FOREIGN PATENT DOCUMENTS 2209753  8/1990  Japan .

Primary Examiner—Olik Chaudhuri
Assistant Examiner—C. Everhart
Attorney, Agent, or Firm—Laff, Whitesel, Conte & Saret

[57] ABSTRACT

A method of fabricating a multi-layered interconnection structure which comprises the steps of: forming a first wiring layer on a silicon oxide film having a compressive stress; forming a thick (2 to 3.5 μm) fluorine-containing silicon oxide film at a temperature not higher than 200° C.; etching back the fluorine-containing silicon oxide film to flatten the surface of the film; forming a silicon oxide film having a compressive stress; forming a through-hole in position; and forming a second wiring layer. Since the fluorine-containing silicon oxide film is used as part of an insulating film, a resistance to cracking, flatness and reliability are significantly improved.

9 Claims, 5 Drawing Sheets

METHOD FOR FABRICATING A SEMICONDUCTOR DEVICE HAVING A MULTI-LAYERED INTERCONNECTION STRUCTURE

BACKGROUND OF THE INVENTION

This invention relates to a semiconductor device and, more particularly, to a method for fabricating a semiconductor device in the form of a multi-layered interconnection structure.

Fabrication of a multi-layered interconnection structure of semiconductor devices has been known, for example, in Japanese Non-examined Patent Publication No. Hei 2-209753. According to this known method, an Al lower wiring layer 502 is formed on an Si substrate 501 as is shown in Fig. 1(a), on which a 0.2-0.3 μm thick plasma-deposited SiO₂ film 503 is formed as shown in FIG. 1(b).

Subsequently, an about 2 μm thick TEOS-SiO₂ film 404 is formed, as shown in FIG. 1(c), at a temperature of 350° C. according to a atmospheric atmospheric vapor phase deposition using tetraethyl orthosilicate (TEOS) and ozone as source gases. As shown in FIG. 1(d), a plasma-deposited SiO₂ film 505 is formed on the film 504. Thereafter, a photoresist film 506 for forming through-holes in position is formed according to a known photolithographic technique (Fig. 1(e)). A through-hole is formed by etching of the film 506. As shown in FIG. 1(f), an Al upper wiring layer 507 is formed. Finally, in order to ensure good electric connection between the Al lower wiring layer and the Al upper wiring layer, the multi-layered structure is wholly heated to a temperature of about 380° C.

However, the above prior art has the following disadvantages. The silicon oxide film which has been formed by the atmospheric pressure chemical vapor deposition using ozone and tetraethyl orthosilicate as the source gases has a high tensile stress. When the film is formed in a thickness of not lower than 1.5 μm under which it is etched back, irregularities will be left with the possibility that tile electrode layer formed on the film will suffer disconnection thereof. Since the film-forming temperature is so high as 350° C., great thermal stress is produced in the inside of the film, with voids being apt to be produced in the Al wirings, thereby causing disconnection of the Al wirings. In addition, the thus formed silicon oxide film has moisture left in large amounts and has a high moisture absorption, resulting in the problem that the film is poor in moisture proofing.

SUMMARY OF THE INVENTION

According to the invention, there is provided a method for fabricating a semiconductor device having a multi-layered interconnection structure; which method comprising the steps of:

(a) forming a first wiring layer on a surface of a semiconductor substrate through an insulating film;

(b) forming a first silicon oxide film on the first wiring layer;

(c) forming a fluorine-containing silicon oxide film on the first silicon oxide film;

(d) forming a flattening film on the fluorine-containing silicon oxide film;

(e) etching back the flattening film by dry etching to remove the flattening film and flatten the surface of the fluorine-containing silicon oxide film;

(f) forming a second silicon oxide film on the flattened surface formed in step (e);

(g) forming in position a through-hole which passes through the first silicon oxide film, the fluorine-containing silicon oxide film and the second silicon oxide film;

(h) forming a second wiring layer on the second silicon oxide film such that part of the second wiring layer connects the first wiring layer through the through-hole; and (i) repeating the steps (b) to (h) to form a repeated number of layers individually formed by the respective steps (b) to (h).

In accordance with a preferred embodiment of the invention, the fluorine-containing silicon oxide film is formed by a chemical vapor phase deposition at a temperature not higher than 200° C. wherein a source gas used includes a vapor mainly composed of an alkoxyfluorosilane ($F_nSi(OR)_{4-n}$ wherein R represents an alkyl group and n is an integer of 1-3) or a mixed vapor of an organosilicon compound, which is free of any fluorine atom, such as tetraethyl orthosilicate ($Si(OC_2H_5)_4$) and an alkoxyfluorosilane, to which steam is added. The first and second silicon oxide films should preferably be formed by chemical vapor phase deposition or sputtering. The stress of the fluorine-containing silicon oxide film should preferably be a compression stress.

The flattening film formed by spin coating and thermal treatment should preferably be at least one of a photoresist film, a polyimide resin film and a spin-on-glass film.

In accordance with another preferred embodiment of the invention, the dry etching is effected using a mixed gas of a fluorine compound gas and an oxygen gas provided that the etching rate of the fluorine-containing silicon oxide film is greater than that of the flattening film. Moreover, the first and second wiring layers are each formed of at least one of aluminium, aluminium alloys, tungsten, molybdenum, titanium, titanium-containing tungsten, titanium nitride, polysilicon, gold, platinum, copper and nickel.

As set out hereinabove, according to the method of the invention, the fluorine-containing silicon oxide film can be formed at low temperatures of 200° C. or below, particularly at temperatures as low as room temperature. In addition, the formed film is small in stress, so that if a thick film whose thickness reaches 3.5 μm is formed, any crack will not be produced. In view of the fact that such a thick film can be formed, when flattening is effected by etching back, better flatness is obtained than in prior art procedures. This leads to the advantage that when the upper wiring layer is formed, there can be obtained a multi-layered interconnection-structure can be obtained without disconnection and short-circuiting.

The fluorine-containing silicon oxide film formed according to the method of the invention has a reduced content of residual moisture and a reduced degree of moisture absorption, with the advantage that the resultant multi-layered interconnection structure is reliable with respect to moisture proofing.

Thus, the invention provides great convenience for fabrication of semiconductor devices.

DETAILED DESCRIPTION OF THE INVENTION

Figure 1A:
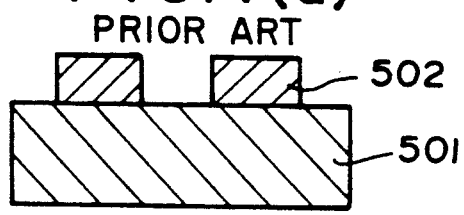
Figs. 1(a) to 1(f) are, respectively, cross-sectional views for illustrating a known procedure of fabricating a double-layered aluminium interconnection structure.
Figure 1B:
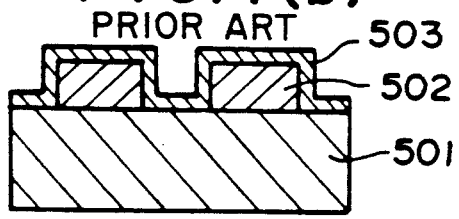
Figure 1C:
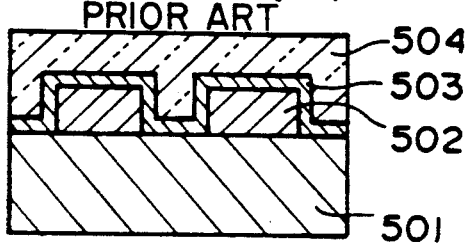
Figure 1D:
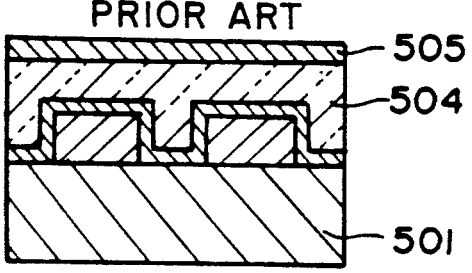
Figure 1E:
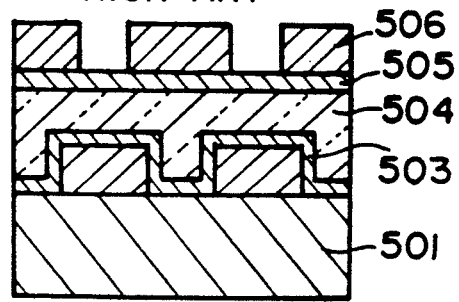
Figure 1F:
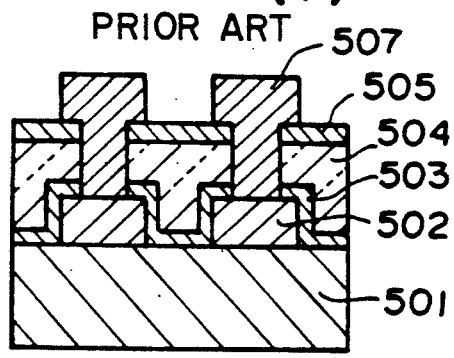
Figure 2:
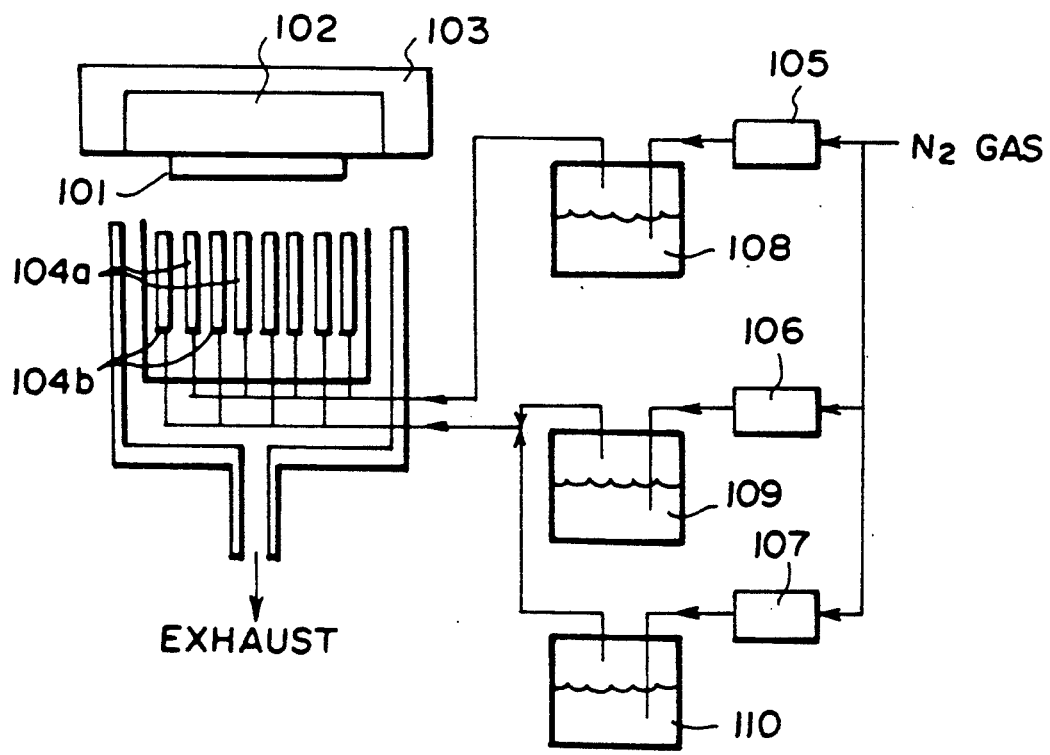
FIG. 2 is a flow chart showing an apparatus for forming a fluorine-containing oxide film according to the invention.

The fabrication method of a semiconductor device according to the invention is described with reference to the accompanying drawings. FIG. 2 schematically shows an apparatus for forming a fluorine-containing silicon oxide film in order to fabricate a semiconductor device according to the method of the invention. The apparatus includes a heater 102 which is accommodated in a reaction chamber (not shown) and is provided for heating a substrate 101 supported on a susceptor 102, and two groups of dispersion heads 104a, 104b provided below the susceptor 103.

The first group of the dispersion heads 104a are fed with steam entrained with a $N_2$ carrier gas through a mass flow controller 105 and a bubbler 108 accommodating pure water.

The second group of the dispersion heads 104b are provided with two gas feed lines for charging a mixed gas of an alkoxyfluorosilane entrained with a $N_2$ carrier gas and tetraethyl orthosilicate entrained with a $N_2$ carrier gas. One of the feed lines has a mass flow controller 106 and a bubbler 109 accommodating the alkoxyfluorosilane, and the other line has a mass flow controller 107 and a bubbler 110 accommodating tetraethyl orthosilicate.

The liquids in the bubblers 108, 109 and 110 are, respectively, kept at a temperature of 50° C.

The steam generated in the bubbler 108 is introduced from the dispersion head 104a into the reaction chamber. At the same time, an alkoxyfluorosilane and tetraethyl orthosilicate are, respectively, vaporized in the bubblers 109, 110, after which the resultant vapors are mixed, followed by introduction from the dispersion head 104b into the reaction chamber. In the reaction chamber, these gases are reacted on the semiconductor substrate 102 on the susceptor 103 which has been maintained at appropriate temperatures of 200° C. or below by means of the heater 102, thereby forming a fluorine-containing silicon oxide film.

In order to give evidence of great utility of the method of the invention, an experiment was carried out wherein a fluorine-containing silicon oxide film was formed on the substrate using the apparatus of FIG. 2. In the experiment, steam and triethoxyfluorosilane (FSi(OC$_2$H$_5$)$_3$) were used as reactant gases and no other organosilicon compounds were used.

A silicon substrate with a diameter of 6 inches was set in the reaction chamber whose pressure was set at a pressure of 700 Torr. The substrate temperature was kept at 30° C. and the reactant gases were charged into the reaction chamber for about 20 minutes to form an about 0.4 μm thick fluorine-containing silicon oxide film.

Figure 3:
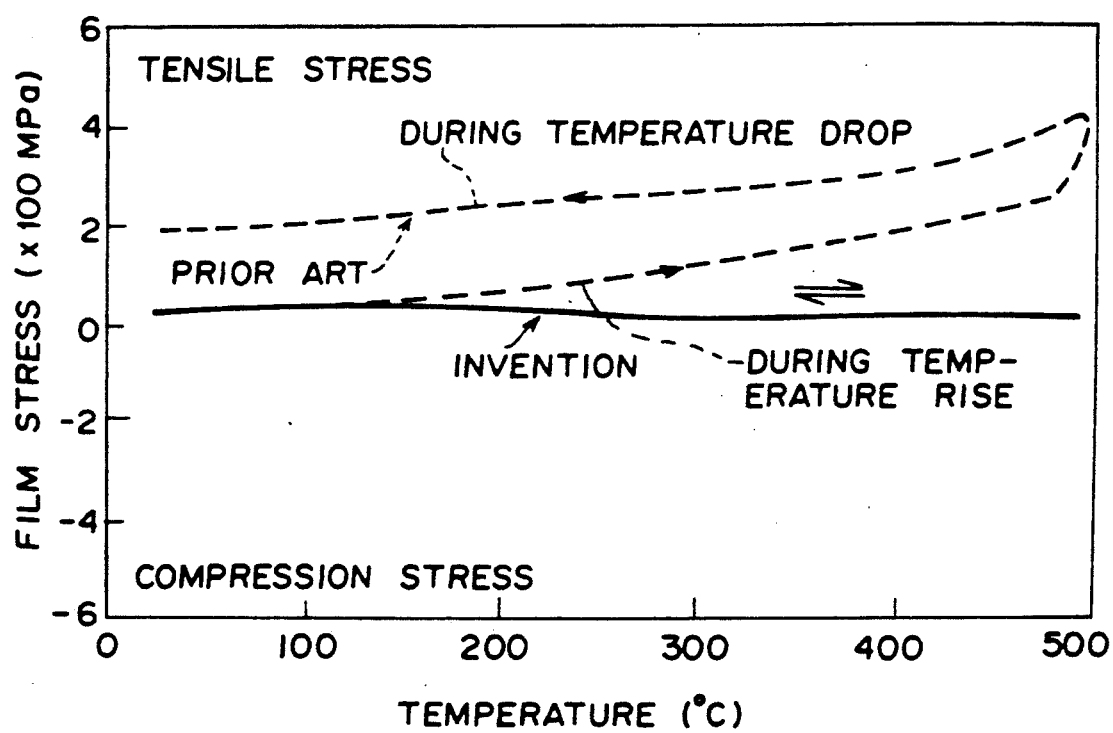
FIG. 3 is a graph showing a variation in film stress in relation to the increase and decrease of temperature of a fluorine-containing silicon oxide film formed according to the invention and a known silicon oxide film.

The physical/chemical and electrical characteristics of the films were found to be as good as those of the film obtained by the method set out in Japanese Non-examined Patent Publication No. Hei 2-209753. The variation of the film stress during temperature increasing and decreasing cycles is shown in FIG. 3 in comparison with a silicon oxide film formed by a prior art procedure at a temperature of 350° C. The film stress was determined from a wafer warpage of the when the temperature was changed from 25° C. to 480° C. at a rate of about 19.8° C./minute. The films were maintained at the maximum temperature of 480° C. for 30 minutes.

From the figure, it will be seen that the fluorine-containing silicon oxide film obtained by the method of the invention suffers little change of the film stress and the stress is substantially at zero MPa at the maximum temperature of 480° C. In contrast, the silicon oxide film formed by tile prior art procedure has an increasing tensile stress during tile cycle of temperature rise and the stress reaches about 420 MPa at 480° C. During the cycle of temperature drop, the stress of the silicon oxide film formed by the prior art procedure is reduced while drawing a hysteresis curve and has a value of about 200 MPa at 25° C.

More particularly, the fluorine-containing silicon oxide film formed by the method of the invention has a small variation in the film stress depending on the temperature, whereas the silicon oxide film formed by the prior art procedure has a large variation in the film stress with a hysteresis characteristic. The large variation in the film stress is considered to result from the fact that the contained moisture is released on heating thereby causing shrinkage of the film. This, in turn, means that the fluorine-containing silicon oxide film obtained according to the invention has a less of moisture content therein. More specifically, the hydrolysis and condensation reactions shown in the following formulae (1) and (2) takes place in the method of the invention at a very low temperature of 30° C.

$$FSi(OC_2H_5)_3 + 3H_2O \rightarrow FSi(OH)_3 + 3C_2H_5OH \quad (1)$$

$$2[FSi(OH)_3] \rightarrow 2[FSiO_{3/2}] + H_2O \quad (2)$$

The reason why the hydrolysis and condensation reactions takes at such a low temperature is assumed to result from the action of fluorine or triethoxyfluorosilane as a catalyst.

Then, the fluorine-containing silicon oxide film is formed on an aluminium wiring pattern at a substrate temperature of 30° C. while changing the film thickness to determine and evaluate the occurrence of cracks in comparison with the case of a prior art procedure. An aluminium film was formed on a substrate with a diameter of 6 inches on which an about 1 μm thick silicon oxide film had been formed according to a plasma chemical vapor deposition process, followed by patterning to obtain an aluminum pattern.

Figure 4:
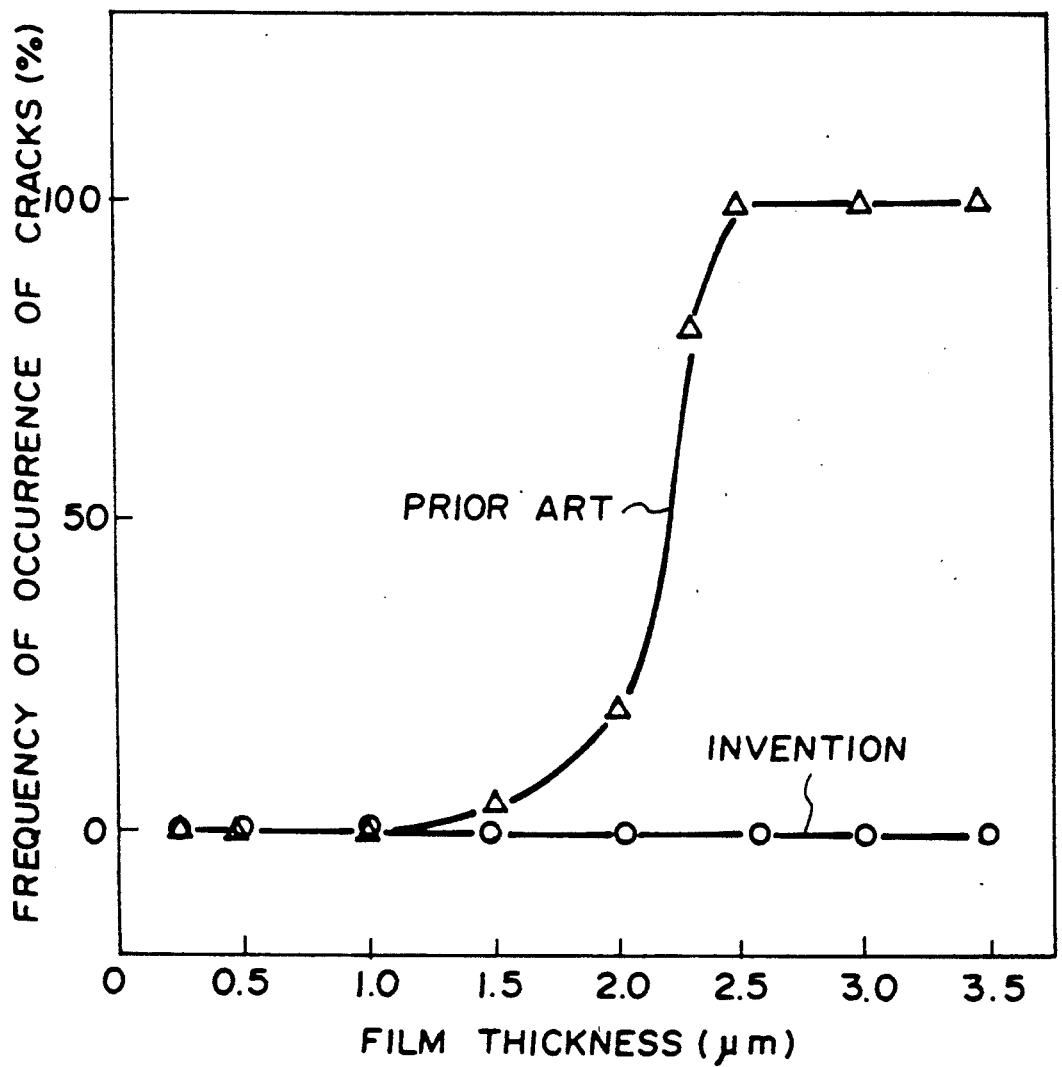
FIG. 4 is a graph showing the relation between the frequency of occurrence of cracks and the film thickness.

Two hundreds chips with the same pattern were microscopically observed to evaluate the presence or absence of cracks in individual aluminium patterns with a size of 5 mm×5 mm. FIG. 4 shows a frequency of occurrence of the cracks when the film thickness is changed. From the figure, it will be seen that when using the fluorine-containing silicon oxide film based on the present invention, no crack is found in a thickness ranging from about 0.25 μm to 3.5 μm.

This is considered for the following reason: Since the fluorine-containing silicon oxide film is formed-at a temperature as low as 30° C. according to the invention, no crack is produced owing to the thermal expansion of the aluminium electrode and the film stress is small. On the other hand, with the silicon oxide film formed by the prior art procedure, the forming temperature is as high as 350 ° C., so that the coefficients of thermal expansion of the aluminium electrode and the silicon oxide film differ by approximately two orders of magnitude and the tensile stress becomes large. By this, the frequency of occurrence of cracks becomes high.

Next, a fluorine-containing silicon oxide film and a prior art silicon oxide film were, respectively, formed on a silicon substrate with a diameter of 6 inches in a thickness of about 0.4 μm, after which each film was immersed in pure water for 24 hours to determine a water absorption from a variation in weight prior to and after the immersion. The water absorption of the fluorine-containing silicon oxide film was about 2 wt %, which was smaller than that of the silicon oxide film formed by the prior art process (about 8 wt %). This is considered owing to the hydrophobic property of the film which contains fluorine atoms.

The fabrication of a semiconductor device having a multi-layered interconnection structure according to an embodiment of the invention is described with reference to FIGS. 5(a) to 5(f).

Figure 5A:
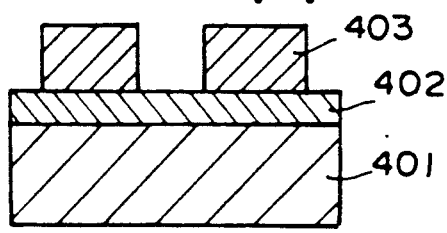
FIGS. 5(a) to 5(h) are, respectively, cross-sectional views showing fabrication of a double-layered aluminium interconnection structure according to the invention.
Figure 5B:
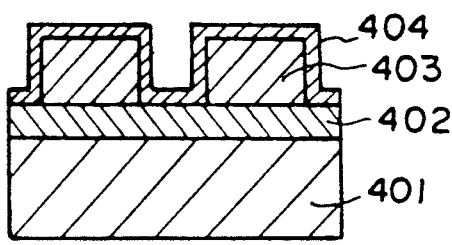

As shown in FIG. 5(a), a semiconductor substrate 401 having an about 0.8 μm thick insulating film 402 which is made of borophosphate glass (BPSG) is provided, on which a first wiring layer 403 made of an about 1 μm thick aluminium film is formed. A first silicon oxide film 404 with a thickness of about 0.2 μm is formed on the insulating film 402 and the wiring layer 403 according to a plasma chemical vapor deposition as shown in FIG. 5(b). The silicon oxide film 404 has been found to have a film stress of about 200 MPa (compressive stress).

Figure 5C:
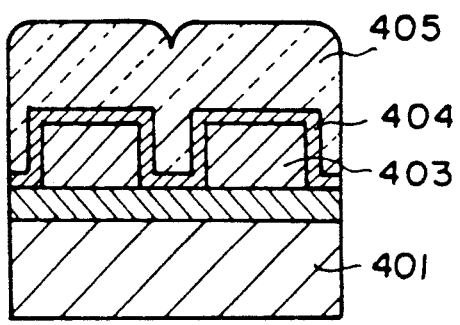

As shown in FIG. 5(c), reactant gases consisting of triethoxyfluorosilane and steam are subjected to chemical vapor phase deposition at a substrate temperature of 30° C. by the use of the apparatus shown in FIG. 2 to form an about 2.5 μm thick Fluorine-containing silicon oxide film 405.

Figure 5D:
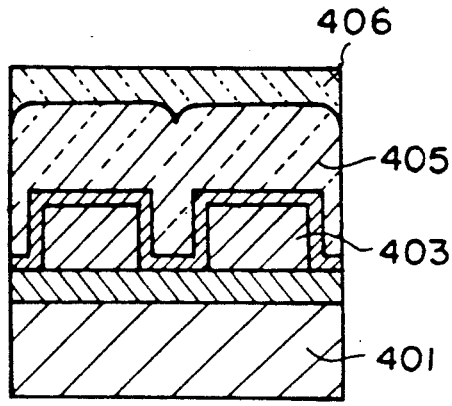
Figure 5E:
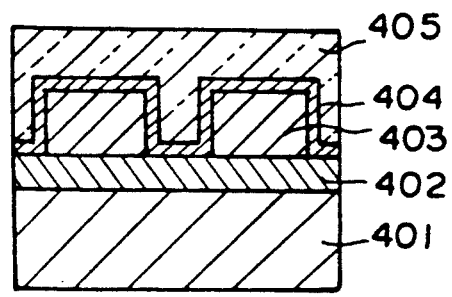

Then, as shown in FIG. 5(d), an about 1 μm thick resist film 406 is formed over the entire surface. This resist film is used as a flattening film. The resist film 406 and the fluorine-containing silicon oxide film 405 are etched back under conditions of flow rates of CF4 gas and O2 gas of 50 sccm and 10 sccm, respectively, a pressure of 10 Pa and radio frequency power of 1000 W, or under conditions where the ratio in the etching rate between the photoresist film and the fluorine-containing silicon oxide film is 1:2. As a result, all the resist film 406 can be removed with the fluorine-containing silicon oxide film on the aluminium wiring layer being reduced to about 0.5 μm in thickness as shown in FIG. 5(e). Thus, the wafer surface can be flattened.

Figure 5F:
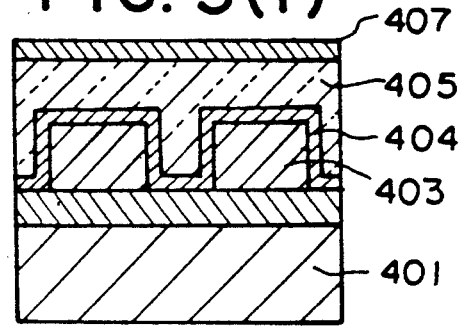

Subsequently, a second silicon oxide film 407 with a thickness of about 0.2 μm is formed by a plasma chemical vapor phase deposition on the fluorine-containing silicon oxide film 405 as shown in FIG. 5(f).

Figure 5G:
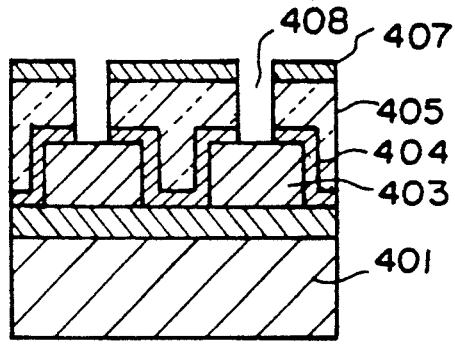
Figure 5H:
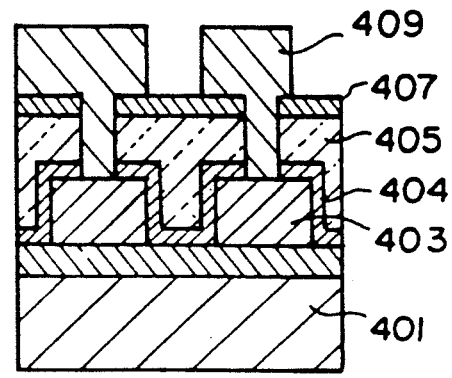

Finally, as shown in FIG. 5(g), through-holes with a diameter of about 1 μm is formed in position, after which a second aluminium wiring layer 409 is formed, as shown in FIG. 5(h), by known sputtering, photolithographic and dry etching techniques.

The two-layered wiring structure formed by the procedure set out hereinabove was found not to have any crack in the insulating film contained therein. Two hundreds chips each having the first and second aluminum wiring layers were checked with respect to disconnection and short-circuiting, with the result that a non-defective rate was 100%. This gives evidence that the stress of the insulating film is small and that the structure has a substantially completely flattened insulating film.

For the formation of the fluorine-containing silicon oxide film in the method of the invention, there can be used source gases consisting of an alkoxyfluorosilane, a fluorine atom-free organosilicon compound and steam as set forth with reference to FIG. 2.

In the steps shown in FIG. 5, the fluorine-containing silicon oxide film of FIG. 5(c) is formed using source Eases consisting of triethoxyfluorosilane, tetraethyl orthosilicate and steam. The film formation is effected using the apparatus of FIG. 2, in which the bubblers 108, 109 and 110 are each set at 50° C. and the N2 gas flow rates are each set at 2 SLM by means of the mass flow controllers 105, 107. Pure water and tetraethyl orthosilicate in the bubblers 108, 110 are vaporized and introduced into the reaction chamber. At the same time, the N2 gas flow rate is controlled at 1 SLM by means of the mass flow controller 106 and triethoxyfluorosilane is vaporized in the bubbler 109 and introduced into the reaction chamber. The substrate obtained after completion of the step of FIG. 5(b) is set in the susceptor and the fluorine-containing silicon oxide film 405 with a thickness of about 2.5 μm is formed at a substrate temperature of 50° C.

With respect to the subsequent steps, the steps set out hereinbefore are repeated to form a double-layered aluminium wiring layer.

The flow rate of the triethoxyfluorosilane is controlled by controlling the N2 gas flow rate at 1 SLM. Of course, any means may be used for the control of the flow rate provided that the triethoxyfluorosilane gas is 5 vol. % or higher based on the total gas in the reaction chamber.

It has been confirmed that no crack is produced in the insulating film of the thus formed two-layered aluminium interconnection and that the first and second aluminium wiring layers have not any disconnection or short-circuiting.

Aluminium has been used as a material for the first and second wiring layers in the above embodiment. Besides, at least one of conductive materials such as aluminium alloys, tungsten, molybdenum, titanium, titanium-containing tungsten, titanium nitride, polysilicon, gold, platinum, copper, nickel and aluminium may be used.

The first and second silicon oxide films may be formed by chemical vapor phase deposition or sputtering. The film stress should preferably be a compressive stress.

Alkoxyfluorosilanes may include, aside from triethoxyfluorosilane, trimethoxyfluorosilane, tripropoxyfluorosilane, tributoxyfluorosilane and the like. Fluorine atom-free organosilicon compounds preferably include, aside from tetraethyl orthosilicate, organic siloxanes including alkoxysilanes such as octamethylcyclotetrasiloxane, tetramethylcyclotetrasiloxane, hexamethyldisiloxane and the like.

The flattening film may include photoresist films, polyimide resin films, spin-on-glass films, or other films. These flattening film may be formed by any known spin coating and thermal treatment.

The formation conditions of the fluorine-containing silicon oxide film are shown only for illustration and the film formation may be effected under wider conditions. As a matter of course, the thicknesses of the aluminium wiring layers, silicon oxide films, fluorine-containing silicon oxide film and photoresist film may be changed, if necessary.

What is claimed is:

1. A method for fabricating a semiconductor device having a multi-layered interconnection structure, which method comprising the steps of:
   (a) forming a first wiring layer on a surface of a semiconductor substrate through an insulating film;
   (b) forming a first silicon oxide film on the first wiring layer;
   (c) forming a fluorine-containing silicon oxide film on the first silicon oxide film;
   (d) forming a flattening film on the fluorine-containing silicon oxide film;
   (e) etching back the flattening film by dry etching to remove the flattening film and flatten the surface of the fluorine-containing silicon oxide film;
   (f) forming a second silicon oxide film on the flattened surface formed in step (e);
   (g) forming in position a through-hole which passes through the first silicon oxide film, the fluorine-containing silicon oxide film and the second silicon oxide film;
   (h) forming a second wiring layer on the second silicon oxide film such that part of the second wiring layer connects the first wiring layer through the through-hole; and
   (i) repeating the steps (b) to (h) to form a repeated number of layers individually formed by the respective steps (b) to (h).

2. A method of fabricating a semiconductor device according to claim 1, wherein said fluorine-containing silicon oxide film is formed by a chemical vapor deposition at a temperature not higher than 200° C. wherein a source gas used includes a mixture of either a vapor mainly composed of an alkoxyfluorosilane ($F_nSi(OR)_{4-n}$) wherein R represents an alkyl group and n is an integer of 1–3′ or a mixed vapor of an organosilicon compound which is free of any fluorine atom and an alkoxyfluorosilane, and steam.

3. A method for fabricating a semiconductor device having a multi-layered interconnecting structure, said method comprising the steps of:
   (a) forming a first wiring layer on a surface of a semiconductor substrate, an insulating film separating said layer and said surface;
   (b) forming a first silicon oxide film on the first wiring layer;
   (c) forming a fluorine-containing silicon oxide film on the first silicon oxide film, said fluorine-containing silicon oxide film being formed by a chemical vapor deposition at a temperature not higher than 200° C. wherein a source gas used includes a vapor mixture taken from a group consisting of mainly an alkoxyfluorosilane (($F_nSi(OR)_{4-1}$) where R represents an alkyl group and n is an integer of 1–3 or an organosilicon compound which is free of any fluorine atoms and an alkoxyfluorosilane, and steam, said alkoxyfluorosilane being one or more members selected from the group consisting of triethoxyfluorosilane, trimethoxyfluorosilane, tripropoxyfluorosilane and tributoxyfluorosilane;
   (d) forming a flattening film on the fluorine-containing silicon oxide film;
   (e) etching back the flattening film by dry etching to remove the flattening film and flatten the surface of the fluorine-containing silicon oxide film;
   (f) forming a second silicon oxide film on the flattened surface formed in step (e);
   (g) forming in position a through-hole which passes through the first silicon oxide film, the fluorine-containing silicon oxide film, and the second silicon oxide film;
   (h) forming a second wiring layer on the second silicon oxide film such that part of the second wiring layer connects the first wiring layer through the through-hole; and
   (i) repeating the steps (b) to (h) to repeatedly form a number of layers individually formed by the respective steps (b) to (h).

4. A method of fabricating a semiconductor device according to claim 1, wherein the first and second silicon oxide films are formed by a chemical vapor deposition and their film stress is a compressive stress.

5. A method of fabricating a semiconductor device according to claim 1, wherein the first and second silicon oxide films are each formed by sputtering and their film stress is a compressive stress.

6. A method of fabricating a semiconductor device according to claim 1, wherein said flattening film is at least one of a photoresist film, a polyimide resin film and a spin-on-glass film.

7. A method of fabricating a semiconductor device according to claim 6, wherein said flattening film is formed by spin coating and thermal treatment.

8. A method of fabricating a semiconductor device according to claim 1, wherein the dry etching is effected using a mixed gas of a fluorine compound gas and an oxygen gas and an etching rate of said flattening film is larger than that of said fluorine-containing silicon oxide film.

9. A method of fabricating a semiconductor device according to claim 1, wherein the first and second wiring layers are formed from at least one member selected from the group consisting of aluminum, aluminum alloys, tungsten, molybdenum, titanium-containing tungsten, titanium nitride, polysilicon, gold, platinum, copper and nickel.

* * * * *